(12) United States Patent
Graff

(10) Patent No.: US 6,545,465 B1
(45) Date of Patent: Apr. 8, 2003

(54) GRIPPER WITH COILED SENSOR WIRE

(75) Inventor: Stephen M. Graff, Maumee, OH (US)

(73) Assignee: Syron Engineering & Manufacturing Corporation, Saline, MI (US)

( * ) Notice: Subject to any disclaimer, the term of this patent is extended or adjusted under 35 U.S.C. 154(b) by 0 days.

(21) Appl. No.: 09/593,513

(22) Filed: Jun. 14, 2000

(51) Int. Cl.[7] ............................ G01B 7/14; B25J 15/00; B25J 19/02; H01B 7/06
(52) U.S. Cl. ........................ 324/207.26; 324/207.2; 174/69; 269/86; 901/35
(58) Field of Search ............... 324/207.2–207.26, 324/235, 251; 174/69; 269/86; 901/31–38, 46; 294/86.4, 104, 106, 110.1; 414/753.1

(56) References Cited

U.S. PATENT DOCUMENTS

| | | | |
|---|---|---|---|
| 3,331,971 A | 7/1967 | Möller | 324/207.2 X |
| 4,086,533 A | 4/1978 | Ricouard et al. | 324/207.2 |
| 4,107,604 A | 8/1978 | Bernier | 324/207.2 |
| 4,229,696 A | 10/1980 | Gustafson | 324/228 X |
| 4,293,837 A | 10/1981 | Jaffe et al. | 338/32 H |
| 4,697,246 A * | 9/1987 | Zemke et al. | 901/46 X |
| 4,730,861 A * | 3/1988 | Spencer | 901/35 X |
| 4,766,322 A * | 8/1988 | Hashimoto | 901/35 X |
| 4,809,191 A * | 2/1989 | Domeier et al. | 901/46 X |
| 4,845,627 A * | 7/1989 | Nadolski et al. | 901/46 X |
| 4,878,705 A * | 11/1989 | Arnquist | 901/36 X |
| 4,906,926 A * | 3/1990 | Rogacki et al. | 901/46 X |
| 4,943,772 A | 7/1990 | Maupu et al. | 324/207.2 |
| 4,970,463 A | 11/1990 | Wolf et al. | 324/207.2 |
| 5,159,268 A | 10/1992 | Wu | 324/207.2 |
| 5,195,377 A | 3/1993 | Garshelis | 73/779 |
| 5,208,532 A | 5/1993 | Alfors | 324/207.2 |
| 5,399,967 A | 3/1995 | Carscadden | 324/207.2 |
| 5,444,369 A | 8/1995 | Luetzow | 324/207.2 |
| 5,477,143 A | 12/1995 | Wu | 324/207.21 |
| 5,647,583 A * | 7/1997 | Emigh et al. | |
| 5,719,496 A | 2/1998 | Wolf | 324/207.2 X |
| 5,796,337 A * | 8/1998 | Wachsman | |
| 5,818,223 A | 10/1998 | Wolf | 324/207.2 X |
| 6,203,084 B1 * | 3/2001 | Kruk et al. | 294/104 |

* cited by examiner

Primary Examiner—Gerard R. Strecker
(74) Attorney, Agent, or Firm—Carlson, Gaskey & Olds

(57) ABSTRACT

A proximity sensing assembly for sensing the proximity of a metallic workpiece to a work holding device includes Hall-effect sensor. The magnetic field generated by the magnet is altered when a metallic workpiece is in close proximity to a magnet. Due to an offset relationship between the sensor and the poles of the magnet, the polarity detected by the Hall-effect sensor is analogous to a reversal when a metallic workpiece is proximate the magnet rather than simply detecting a change in strength. Thus the polarity detected by the Hall-effect sensor sends a clearly defined signal indicating the presence or absence of a workpiece in the work holding device.

2 Claims, 2 Drawing Sheets

GRIPPER WITH COILED SENSOR WIRE

BACKGROUND OF THE INVENTION

The subject invention relates to an improved proximity sensor having an improved orientation of a Hall-effect sensor in combination with a magnet for sensing the proximity of a workpiece.

Modern work transfer systems, such as high-speed transfer presses have required the movement of metal workpieces at high rates of speed. A holding device such as a robotic gripper, a suction cup, etc. disposed at the end of a robot arm, has been used to facilitate the movement of the workpieces into and out of the dies. It is desirable for a controller to detect if the holding device is actually gripping a metal workpiece.

A typical holding device having proximity sensing capabilities includes a proximity sensor. The proximity sensor comprises a current carrying coil in communication with a bridge circuit oscillator. As a metallic workpiece approaches the coil, the electrical current flowing through the coil is interrupted terminating oscillation in the bridge circuit. This generates a fault signal to a controller indicating a workpiece is proximate to the gripper. The absence of an interruption of electrical current when a workpiece should be present generates a fault signal.

Known proximity sensors utilizing a current carrying coil in communication with a bridge circuit oscillator for determination of proximity of a metal workpiece have not always proven sensitive enough. This type of sensor may not always detect the absence of a workpiece and, therefore, not generate a fault signal. An additional type of proximity sensor is a Hall-effect sensor axially aligned with the poles of a magnet. The Hall-effect sensor detects a magnetic field and generates a voltage output relative to the strength of the magnetic field detected. The proximity of metal to the magnet alters the magnetic field detected by the Hall-effect sensor resulting in an altered voltage output ultimately generating a fault signal. However, the axial orientation of the Hall-effect sensor to the poles of a magnet has not proven sensitive enough to provide consistently accurate workpiece detection.

Therefore, a need exists for a proximity sensor for sensing the proximity of a workpiece to a robotic gripper that is more sensitive and therefore more reliable than the currently utilized sensors.

SUMMARY OF THE INVENTION AND ADVANTAGES

A proximity sensing assembly for sensing the proximity of a metallic workpiece includes a holding device and a proximity sensor. The proximity sensor comprises a magnet and a Hall-effect sensor. The Hall-effect sensor is positioned in an offset relationship (i.e. non-concentric) to the poles of the magnet. A metallic workpiece alters the magnet field generated by the magnet. The Hall-effect sensor detects the presence or absence of a metallic workpiece by detecting a change in the magnetic field relative to the proximity of a workpiece and emitting an altered level of voltage. The voltage emitted by the Hall-effect sensor is proportionally related to the strength of the magnetic field.

A proximity sensor utilizing a magnet and a Hall-effect sensor positioned offset from the magnet poles has proven to be much more sensitive than known proximity sensors. The increase in sensitivity of the subject proximity sensor over known sensors reduces the probability of a workpiece detection error and, therefore, provides a more dependable robotic gripper for use in a transfer press operation.

BRIEF DESCRIPTION OF THE DRAWINGS

Advantages of the present invention will be readily appreciated as the same becomes better understood by reference to the following detailed description when considered in connection with the accompanying drawings wherein.

DETAILED DESCRIPTION OF THE PREFERRED EMBODIMENT

Figure 1:
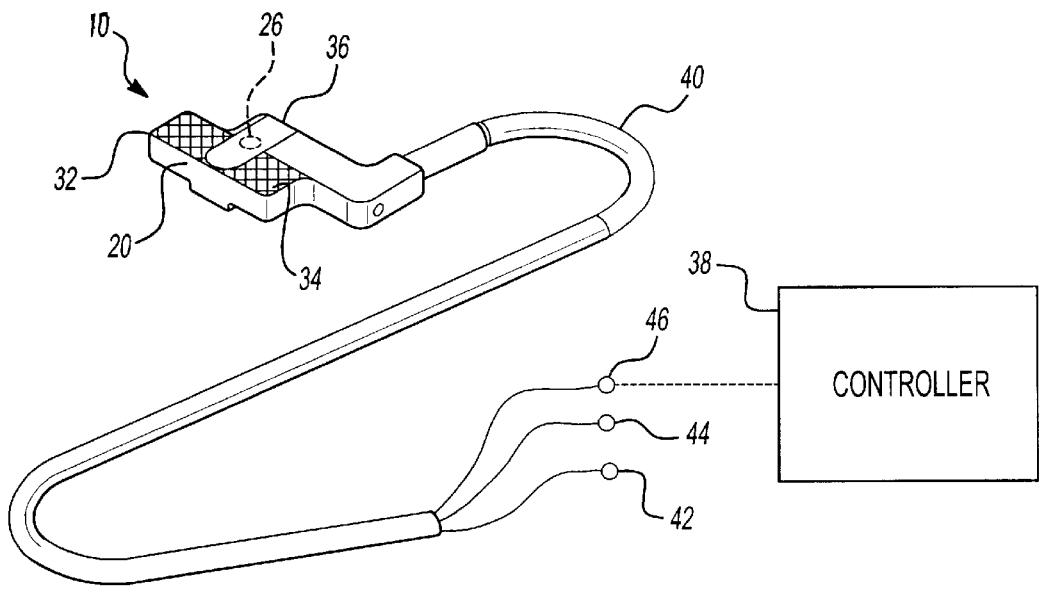
FIG. 1 is a perspective view of the subject proximity sensing assembly.

Referring to FIG. 1, wherein like numerals indicate like or corresponding parts, a proximity sensing assembly is generally shown at 10. The assembly, 10 which senses the proximity of a metallic workpiece is generally shown mated to a robotic gripper at 12 of FIG. 2. During operation, the gripper 12 is affixed to the end of a robot arm 14. The gripper 12 includes a first appendage 16 and a second appendage 18, which work together for gripping metal workpieces. A first gripper pad 20 is affixed to the first appendage 16 and a second gripper pad 22 is affixed to the second appendage 18. Each appendage 16, 18 includes a screw 24 for fixedly attaching the gripper pads 20, 22 to the appendages 16, 18.

Figure 3:
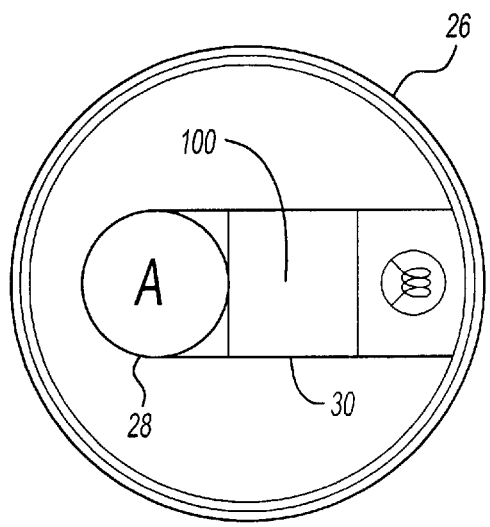
FIG. 3 is top view of the proximity sensor showing the orientation of the Hall-effect sensor to the magnet.

A proximity sensor 26 is disposed within the first gripper pad 20 for sensing the proximity of the workpiece to the gripper 12. As can be seen in FIG. 3, the proximity sensor 26 comprises a magnet 28 and a Hall-effect sensor 30. The magnet 28 is contemplated to be a cylindrical type magnet 28 having a north and a south pole as is known in the art of magnets. As best shown in FIG. 3, the Hall-effect sensor 30 is positioned in an offset relationship to the poles of the magnet 28.

As the gripper 12 approaches a metallic workpiece, the polarity of the magnetic field is altered. The Hall-effect sensor 30 detects the change in polarity and generates a voltage proportional strength to the magnetic field detected. Because the Hall-effect sensor 30 is offset from the poles of the magnet 28, the charge sensed in the magnetic field is equivalent to a reverse in polarity of the magnetic field.

Figure 4A:
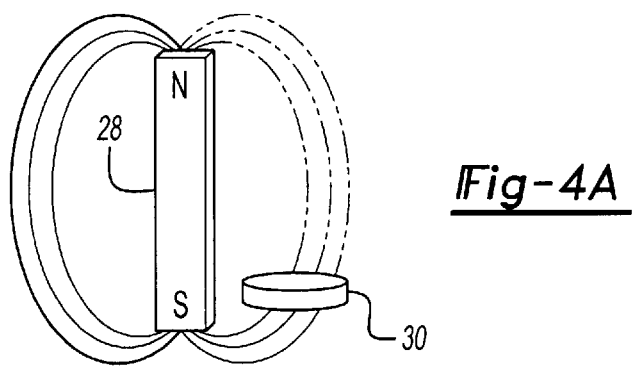
FIG. 4a is a perspective view of the Hall-effect sensor in an offset relationship to the magnet showing magnetic fields in the absence of a metal workpiece.
Figure 4B:
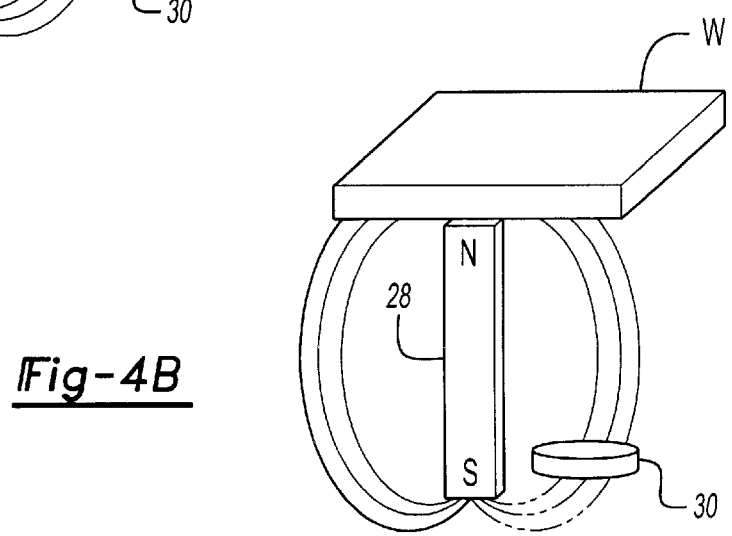
FIG. 4b is a perspective view of the Hall-effect sensor in an offset relationship to the magnet showing magnetic fields in the presence of a metal workpiece.

Referring to FIG. 4a, the Hall-effect sensor 30 is shown in the offset relationship to the poles of the magnet 28 subject to the magnetic field of the magnet. By positioning the Hall-effect sensor 30 closer to one pole, here the south pole, of the magnet 28, the sensor 30 will effectively detect only the south pole. It is understood in the art of magnets that a conductive metal has less resistance to magnetic fields than does air. Therefore, the presence of a metallic workpiece proximate to the north pole, as represented in FIG. 4b, will increase the strength of the magnetic field emitted from the north pole to a level overpowering the field emitted from the south pole. This effectively reverses the polarity detected by the Hall-effect sensor 30 from south to north. This reversal in sensed polarity enhances the sensitivity of the Hall-effect sensor 30 providing consistent and accurate detection of proximity of a workpiece. That is, rather than attempting to detect slight changes in magnetic field strength, the controller now can look for a sensed reverse in polarity to detect the presence of a workpiece. It is therefore desirable to have the Hall-effect sensor 30 offset with respect to both the axial alignment of the magnetic poles and to the distance between the poles.

In addition, the offset proximity sensor 26 can detect proximity of a workpiece at a greater distance of up to 5 mm, much greater than a sensor having the Hall-effect sensor 30 arranged axially to the magnetic field. However, in practice, the distance of sensitivity will be tuned to prevent erroneously reading the opposite appendage 18 as a workpiece.

The first gripper pad 20 includes right and left abrasive surfaces 32, 34 for gripping the workpiece. A plate 36 is disposed between the right and left abrasive surfaces having the proximity sensor 26 disposed therein. The plate 36 is contemplated to be stainless steal for providing a corrosion proof enclosure for the proximity sensor 26.

The assembly 10 includes a controller 38 for receiving signals from the Hall-effect sensor 30. The voltage generated by the Hall-effect sensor 30 is transmitted to the controller 38 via a cable 40. The cable 40 includes three wires as is commonly used in the art of Hall-effect sensors. The first wire 42 carries power voltage to charge the Hall-effect sensor 30, the second wire 44 supplies the sensor ground, and the third wire 46 delivers the Hall-effect sensor's 30 voltage output to the controller 38.

The proximity sensor 26 includes a transistor for amplifying output from the Hall-effect sensor 30. The amplification of the voltage by the transistor improves the voltage transfer from the Hall-effect sensor 30 to the controller 38 for determining the proximity of the workpiece to the gripper 12. Voltage amplification improves operation of the circuit connecting the proximity sensor 26 to the controller 38.

Figure 2:
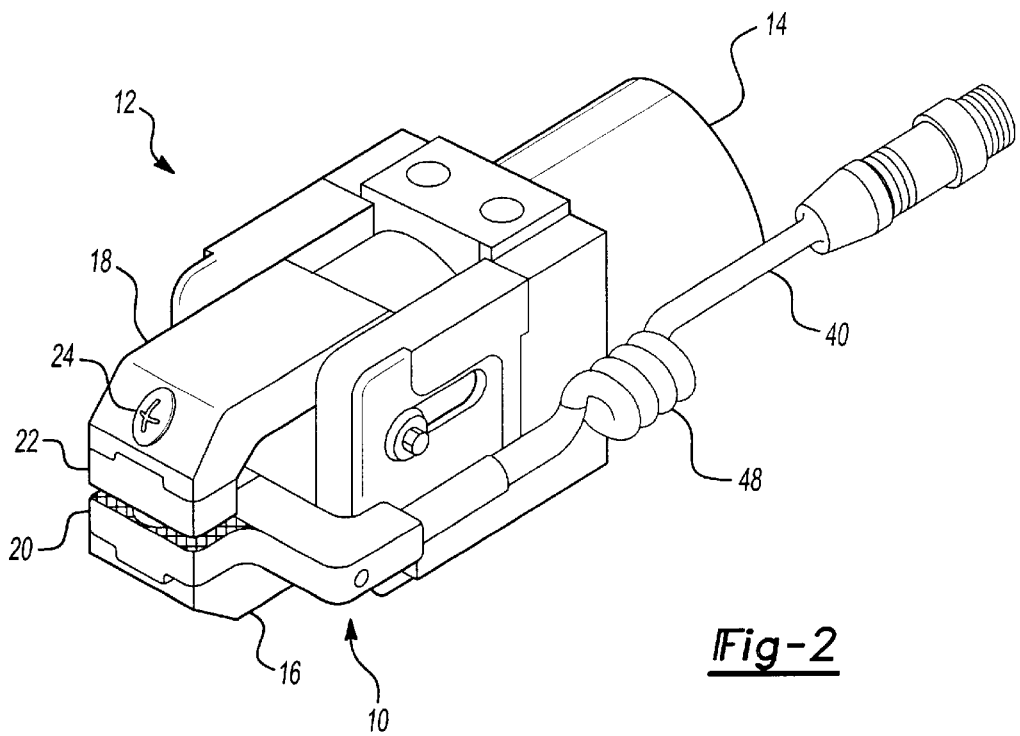
FIG. 2 is a perspective view of the subject proximity sensing assembly affixed to an appendage of the robotic gripper.

As best shown in FIG. 2, the cable 40 includes a coil 48 for allowing the cable 40 to stretch. It is desirable for improved gripper 12 functionality for the first appendage 16 to pivot on the gripper 12 as does the second appendage 18. The pivotal movement of the first appendage 16 can contribute to premature wear of the cable 40. To reduce wear, the coil 48 in the cable 40 will allow the cable 40 to stretch as the first appendage 16 pivots upon the gripper 12.

The invention has been described in an illustrative manner, and it is to be understood that the terminology which has been used is intended to be in the nature of words of description rather than of limitation. While the invention is shown in a gripping device, other work holding devices will benefit from this invention. As an example, suction cups and other known work holding devices would benefit from this invention.

Many modifications and variations of the present invention are possible in light of the above teachings. It is, therefore, to be understood that within the scope of the appended claims, wherein reference numerals are merely for convenience and are not to be in any way limiting, the invention may be practiced otherwise than as specifically described.

What is claimed is:

1. A gripper assembly comprising:

a pair of appendages, with at least one of said appendages being pivotably moveable relative to a second of said appendages; and a proximity sensor for sensing the presence of a work piece between said appendages, said sensor mounted within said one of said appendages, and a cable including a coiled portion communicating said sensor to a controller, said coiled portion allowing said cable to stretch as said one appendage pivots relative to said other appendage.

2. A gripper assembly as set forth in claim 1, wherein said cable is fixed to said appendage, with said coiled portion extending from a location at which said cable is fixed to said appendage.

* * * * *